(12) United States Patent
Hamman

(10) Patent No.: US 6,529,376 B2
(45) Date of Patent: Mar. 4, 2003

(54) SYSTEM PROCESSOR HEAT DISSIPATION

(76) Inventor: Brian Alan Hamman, 845 Fairview Dr., Aubrey, TX (US) 76227

( * ) Notice: Subject to any disclaimer, the term of this patent is extended or adjusted under 35 U.S.C. 154(b) by 0 days.

(21) Appl. No.: 09/922,380

(22) Filed: Aug. 3, 2001

(65) Prior Publication Data

US 2002/0021555 A1 Feb. 21, 2002

Related U.S. Application Data

(60) Provisional application No. 60/224,286, filed on Aug. 10, 2000.

(51) Int. Cl.[7] .................................................. H05K 7/20
(52) U.S. Cl. ..................... 361/698; 165/80.4; 174/15.1; 361/699
(58) Field of Search ........................ 62/259.2; 174/15.1, 174/16.3; 165/80.3, 80.4, 104.33; 257/714; 361/687, 690, 694, 695, 697–698, 699, 701, 704, 705, 717–719, 722

(56) References Cited

U.S. PATENT DOCUMENTS

| | | | | |
|---|---|---|---|---|
| 5,473,508 A | * | 12/1995 | Porter et al. ................. 361/695 |
| 5,731,954 A | * | 3/1998 | Cheon ......................... 361/699 |
| 5,823,005 A | * | 10/1998 | Alexander et al. .......... 62/259.2 |
| 5,996,353 A | * | 12/1999 | Maxwell et al. .............. 62/3.2 |
| 6,263,957 B1 | * | 7/2001 | Chen et al. .................. 165/80.4 |
| 6,313,990 B1 | * | 11/2001 | Cheon ......................... 361/699 |
| 6,333,849 B1 | * | 12/2001 | Donahoe et al. ............ 361/687 |

* cited by examiner

*Primary Examiner*—Gerald Tolin
(74) *Attorney, Agent, or Firm*—Kelly Bauersfeld Lowry & Kelley, LLP

(57) ABSTRACT

A system for heat dissipation in data processing applications is disclosed, including a heat transfer unit matably engaged with a data processing unit and adapted to transfer heat from the data processing unit to a fluid, a fluidic transport system coupled to the heat transfer unit and adapted to provide cooled fluid to, and retrieve heated fluid from, the heat transfer unit, a fluid reservoir coupled to the fluidic transport system, adapted to store cooled fluid and to deliver cooled fluid to the fluidic transport system, and a heat exchange unit coupled to the fluidic transport system and to the fluid reservoir, adapted to receive heated fluid from the fluidic transport system, to cool the fluid, and to deliver the cooled fluid to the fluid reservoir.

21 Claims, 6 Drawing Sheets

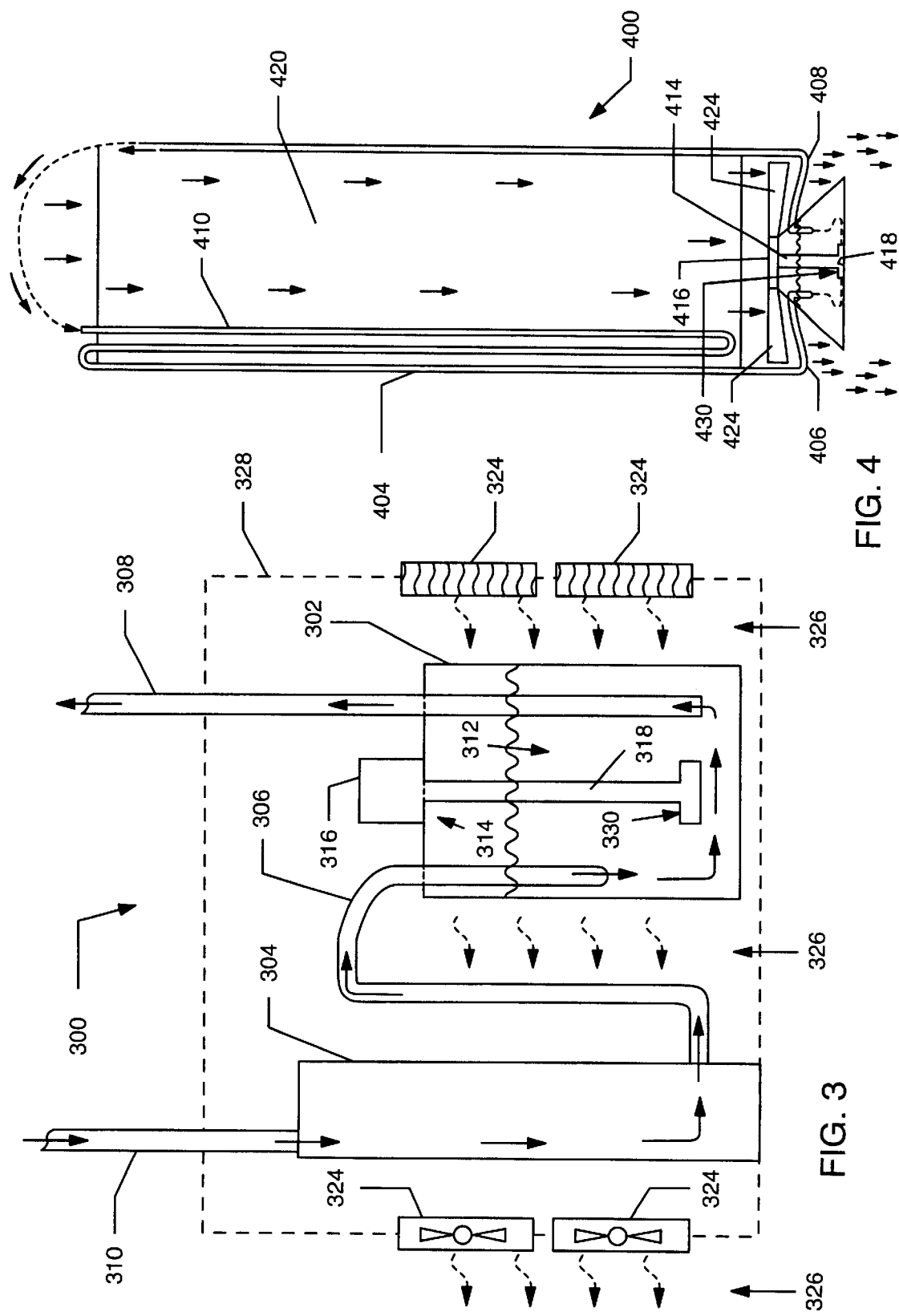

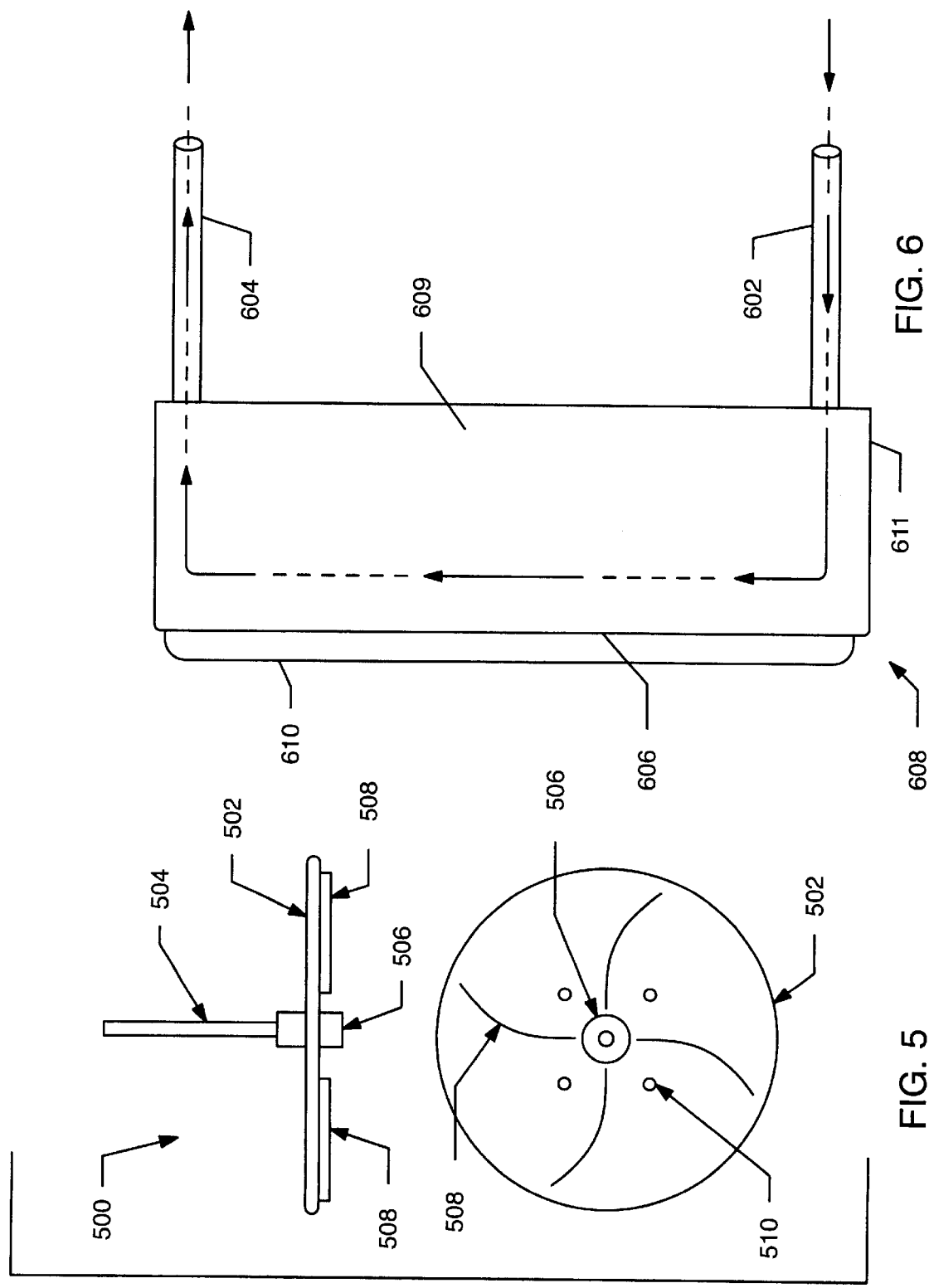

SYSTEM PROCESSOR HEAT DISSIPATION

RELATED APPLICATION

This application claims priority from U.S. Provisional Patent Application Serial No. 60/224,286, filed Aug. 10, 2000.

TECHNICAL FIELD OF THE INVENTION

The present invention relates, in general, to heat dissipation systems, and in particular, to a versatile and cost-effective system for dissipating heat generated by high speed central processing units and other high performance data processing componentry.

BACKGROUND OF THE INVENTION

The continual demand for enhanced data processing performance has resulted in numerous advancements in data processing technology and processes. The operational speed of data processing components, such as central processing units, has continually and steadily been increased over time to meet this demand. Data processing system designers have known for some time that as data processing system components are operated at higher speeds, they generate more heat-effectively becoming a heat source within the system. That increased heat can seriously degrade the performance of, and even damage, high performance data processing components. This phenomenon is especially true for semiconductor devices within data processing systems. Generation of and exposure to extreme heat during operation can cause semiconductor devices to malfunction or fail completely. In the Pentium IIII computer processor the problem has become so severe that its designer has integrated into its design "speed step technology" that actually reduces the processor speed by 50% or more due to the fact that its thermal output is to high for conventional methods of cooling. This poses a serious performance barrier as well as system reliability and integrity problem. Those designers are continually forced to make trade-offs balancing increased system performance against system reliability due to heat concerns.

Lately, such trade-offs have focused in large part on central processing units and other high speed processing components. Numerous advancements in processor technology have produced processing units that are capable of operation 10 to 70% higher speeds if proper cooling is utilized. Practically, however, systems designers have typically not been able to utilize the full potential of such devices due to the heating problems previously discussed. Instead, they have had to operate processing units at some fraction of their full potential speed—at the point where they choose to balance the performance and reliability issues. As advances in other data processing componentry present the same issues, similar trade-offs will also have to be made.

In the past, a number of attempts have been made to address and minimize heating problems and concerns. Most such approaches have focused on circulation and cooling of ambient air surrounding a processing unit providing an indirect and inefficient method of transferring heat away from high speed processing devices. Some of those approaches were quite elaborate and costly, such as operating data processing systems in specially constructed "Cold Rooms" with extreme operating cost due to high power consumption of air conditioning and setup cost. Typically, a room having raised floors was constructed to house high performance processing equipment. Elaborate ventilation, and in some cases cooling, systems were installed in the floor and ceiling to circulate a high volume of air through the room. Data processing equipment was typically then installed in open racks in the room for operation. Aside from the considerable cost and effort associated with constructing such rooms, their isolated and often remote nature made maintenance difficult and usage impractical. Furthermore, the benefits realized from these rooms was still limited by the inefficiency of the indirect (ambient) cooling scheme.

Other conventional approaches, while smaller in scale and somewhat more cost efficient than specially constructed rooms, still utilized the inefficient indirect cooling schemes. These approaches focused again on providing ventilation of ambient air around processing units—usually in smaller, more confined processing systems (e.g. personal computers). Examples of such approaches include providing simple ventilation holes or slots, or the installation of motorized fans, in processing system cabinets. Other approaches have attempted to provide fan-type assemblies mounted on, or in close proximity to, a central processing unit. Such approaches have realized nominal benefits, and often disproportionately increase system cost and complexity when compared with the benefits realized.

A few attempts at providing a more direct heat dissipation methodology have been made. Most such attempts involved highly elaborate multistage cooling and heating systems attempting to sink heat away from a data processing unit, and generally required numerous bulky electromechanical units and elaborate connections therebetween. Systems utilizing such approaches typically faced a number of collateral system and performance concerns resulting from the inclusion of such systems, such as electromagnetic field interference and condensation problems when refrigeration is employed. Furthermore, the considerable unit costs associated with producing and implementing such systems was typically prohibitive for use in high volume consumer applications—especially where additional modifications were added to address the collateral system effects previously referenced. The bulk and complexity of these systems commonly limited their utilization to server and larger computer platforms; they were not readily scalable for use in smaller, hand held consumer applications.

With processor temperature approaching 200 deg. F. in some cases, an efficient new method is needed to cool high performance processors. Therefore, a versatile and readily scalable system for dissipating heat generated by processing componentry in a highly efficient and cost-effective manner is now needed; providing full realization of high-speed processing unit performance and improved system reliability while overcoming the aforementioned limitations of conventional methods.

SUMMARY OF THE INVENTION

In the present invention, a heat transfer unit is directly engaged with the surface of a processing unit. A liquid coolant is circulated through the heat transfer unit by a transport system which delivers cooled liquid from, and returns heated liquid to, an external heat exchange system; providing continuous and highly efficient direct heat dissipation from the processing unit in a readily adaptable manner.

The present invention provides a heat dissipation system including a heat transfer unit matably engaged with a data processing unit and adapted to transfer heat from the data processing unit to a fluid, a fluidic transport system coupled to the heat transfer unit and adapted to provide cooled fluid to, and retrieve heated fluid from, the heat transfer unit, a fluid reservoir coupled to the fluidic transport system, adapted to store cooled fluid and to deliver cooled fluid to the fluidic transport system, and a heat exchange unit coupled to the fluidic transport system and to the fluid reservoir, adapted to receive heated fluid from the fluidic transport system, to cool the fluid, and to deliver the cooled fluid to the fluid reservoir.

The present invention further provides a CPU cooling system comprising a heat sink device adjoined with one or more surfaces of the CPU and adapted to transfer heat from the CPU to a liquid, a first transport conduit coupled to the heat sink device and adapted to provide cooled liquid to the heat sink device, a second transport conduit coupled to the heat sink device and adapted to retrieve heated liquid from the heat sink device, a reservoir coupled to the first transport conduit and adapted to store cooled liquid and to deliver cooled liquid to the first transport conduit, and a heat exchange unit coupled to the second transport conduit and to the reservoir, adapted to receive heated liquid from the second transport conduit, to cool the liquid, and to deliver the cooled liquid to the reservoir.

The present invention also provides a fluidic impeller comprising a base plate, a shaft coupled normally to the base plate by a hub, a plurality of co-radially curved blade members radially and equidistantly disposed upon an upper surface of the base plate, and one or more apertures formed through the base plate in positional relationship to the blade members to effect a stable movement of fluid by the impeller.

The system in this application has been tested and produces a significant temperature reduction in computer processors of up to 100 deg. F. while only consuming 5.78 watts of power. The efficiency is due in part to the fact that the heat energy is used to help power coolant flow through convection circulation. The processor is maintained at an average of 5 to 10 degrees above ambient temperature in the prototype. By virtually removing heat from the equation existing processors can be operated at higher speeds, performance increases of up to 70% have been observed while using the prototype system. This can result in tremendous performance gains in commercial applications as well as increased productivity in the work place due to faster computers and improved reliability. The preferred coolant for this system is approved by the FDA for use in food products and will not freeze until approximently −75 degrees F. This makes the system extremely safe and stable.

Another benefit of the system is by directly discharging the heat from the computer or other data processing device, the internal temperature of the entire system in reduced which has the effect of increasing the reliability of all of the remaining components due to their lower operating temperature.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

For a more complete understanding of the features and advantages of the present invention, reference is now made to the detailed description of the invention along with the accompanying FIGS. in which corresponding numerals in the different figures refer to corresponding parts and in which:

FIG. 3 is an illustrative depiction of one embodiment of a heat exchange system.

FIG. 4 is an illustrative depiction of another embodiment of a heat exchange system.

FIG. 5 is an illustrative depiction of one embodiment of a fluidic impeller.

FIG. 6 is an illustrative depiction of a microprocessor heat sink.

DETAILED DESCRIPTION OF THE PREFERRED EMBODIMENT

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

It should be understood that the principles and applications disclosed herein can be applied in a wide range of data processing applications. The present invention solves performance and reliability problems associated with heating of various data processing components. The present invention may be utilized in a number of computing, communications, and personal convenience applications. For example, the present invention could be implemented in a variety of personal computers, cell phones, and personal digital assistants (PDAs). The present invention is equally applicable to a number of processing components and devices (e.g., central processing units or digital signal processors) within such hardware systems. For purposes of explanation and illustration, the present invention is hereafter described primarily in reference to a central processing unit (CPU) within a personal computer.

Figure 1:
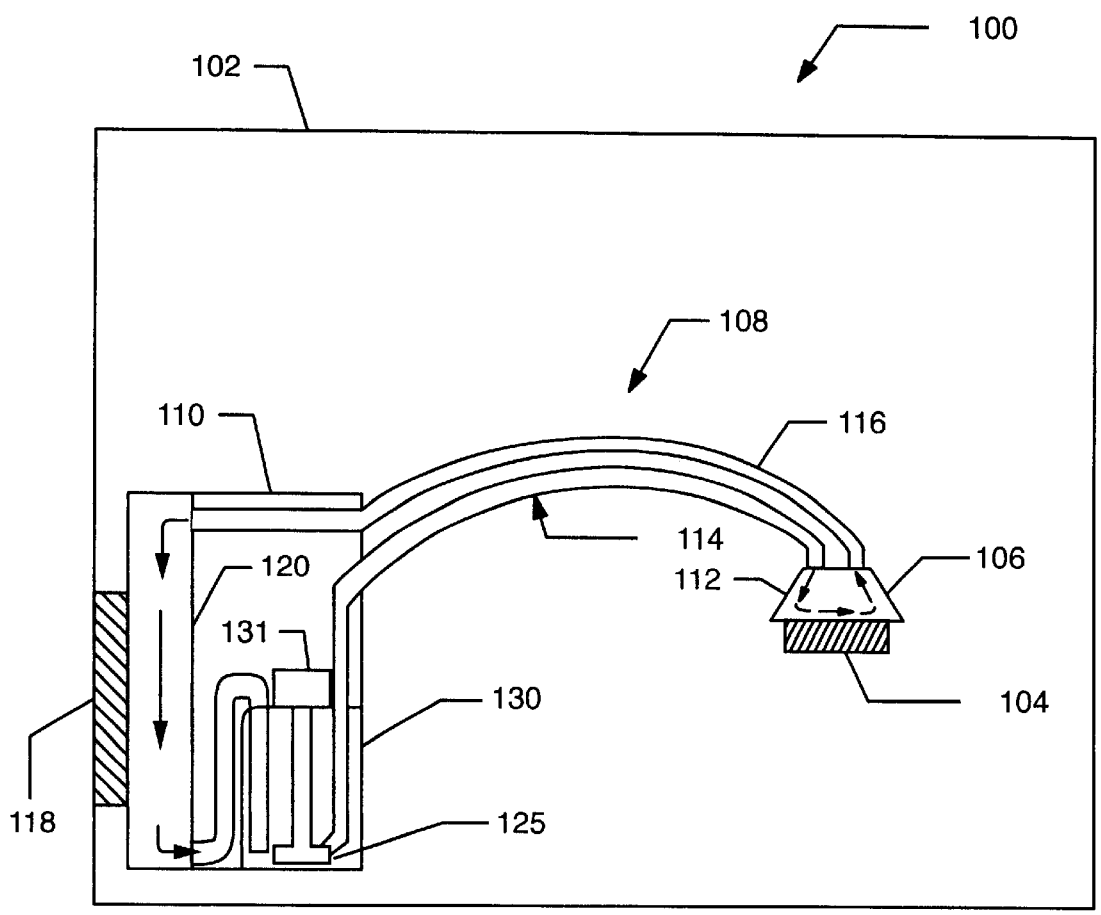
FIG. 1 is an illustrative depiction of a data processing system.
Figure 2:
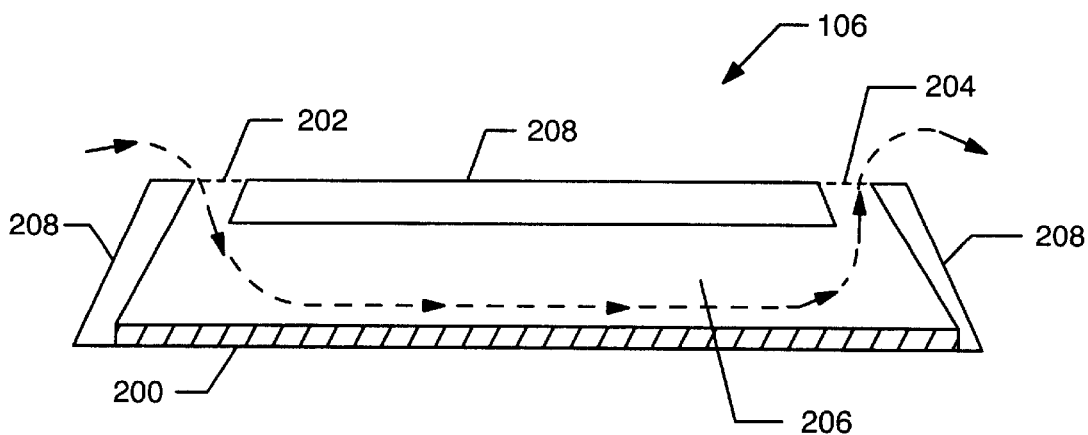
FIG. 2 is an illustrative depiction of one embodiment of a heat transfer unit.

Referring now to FIG. 1, a data processing and cooling system 100 according to the present invention is depicted. System 100 comprises a housing 102 (e.g., a computer cabinet or case) and a processing unit 104 (e.g., a CPU or microprocessor) disposed within housing 102. System 100 further comprises a heat transfer unit 106 engaged with one or more surfaces of unit 104, a transport system 108, and a heat exchange system 110. A fluidic coolant is circulated through heat transfer unit 106, as indicated by flow indicators 112, by transport system 108. System 108 delivers cooled fluid from, and returns heated fluid to, heat exchange system 110.

Figure 8:
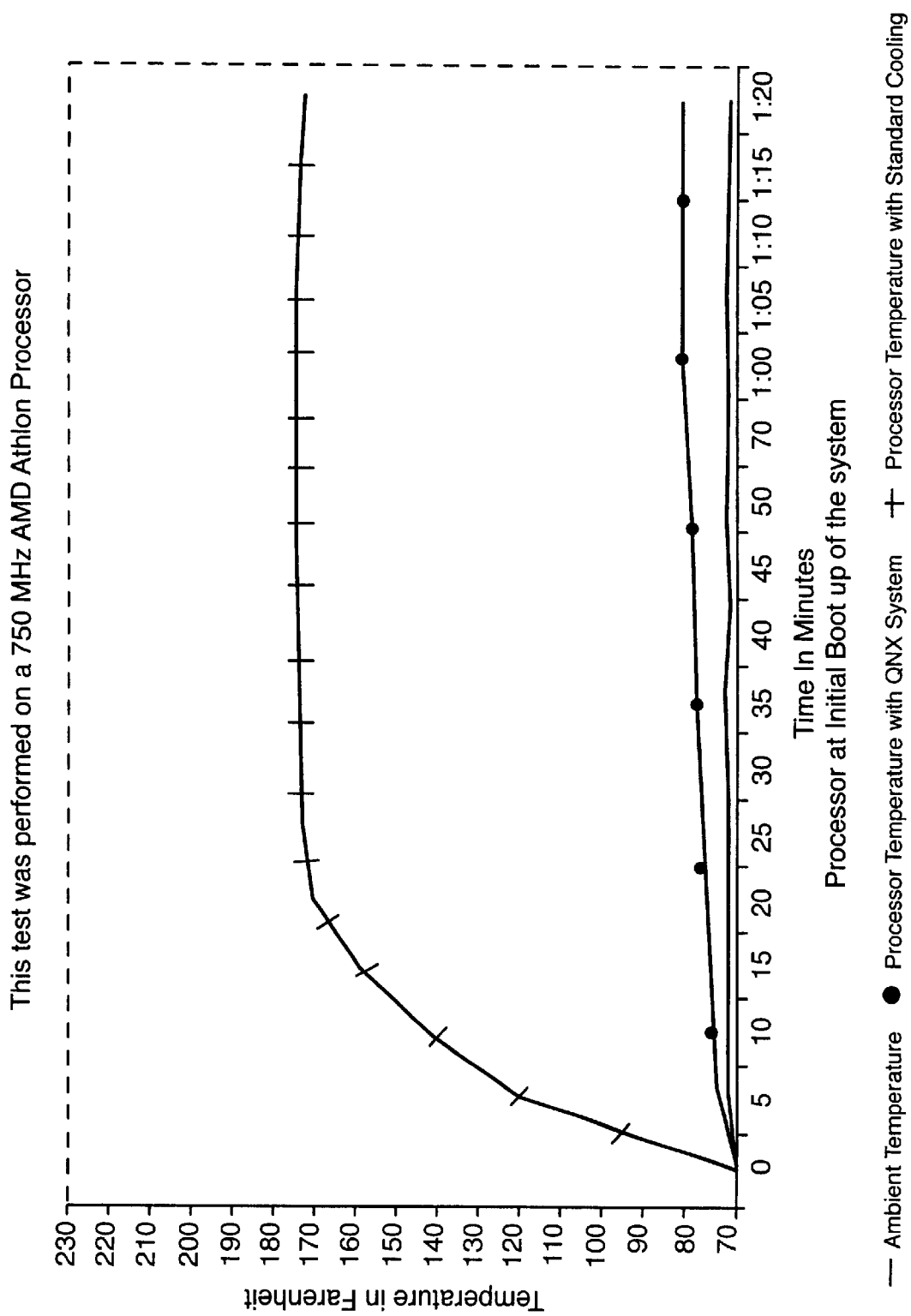
FIG. 8 is a graph illustrating ambient temperature, temperature of a processor under normal operating conditions, and with implementation of the present invention.
Figure 9:
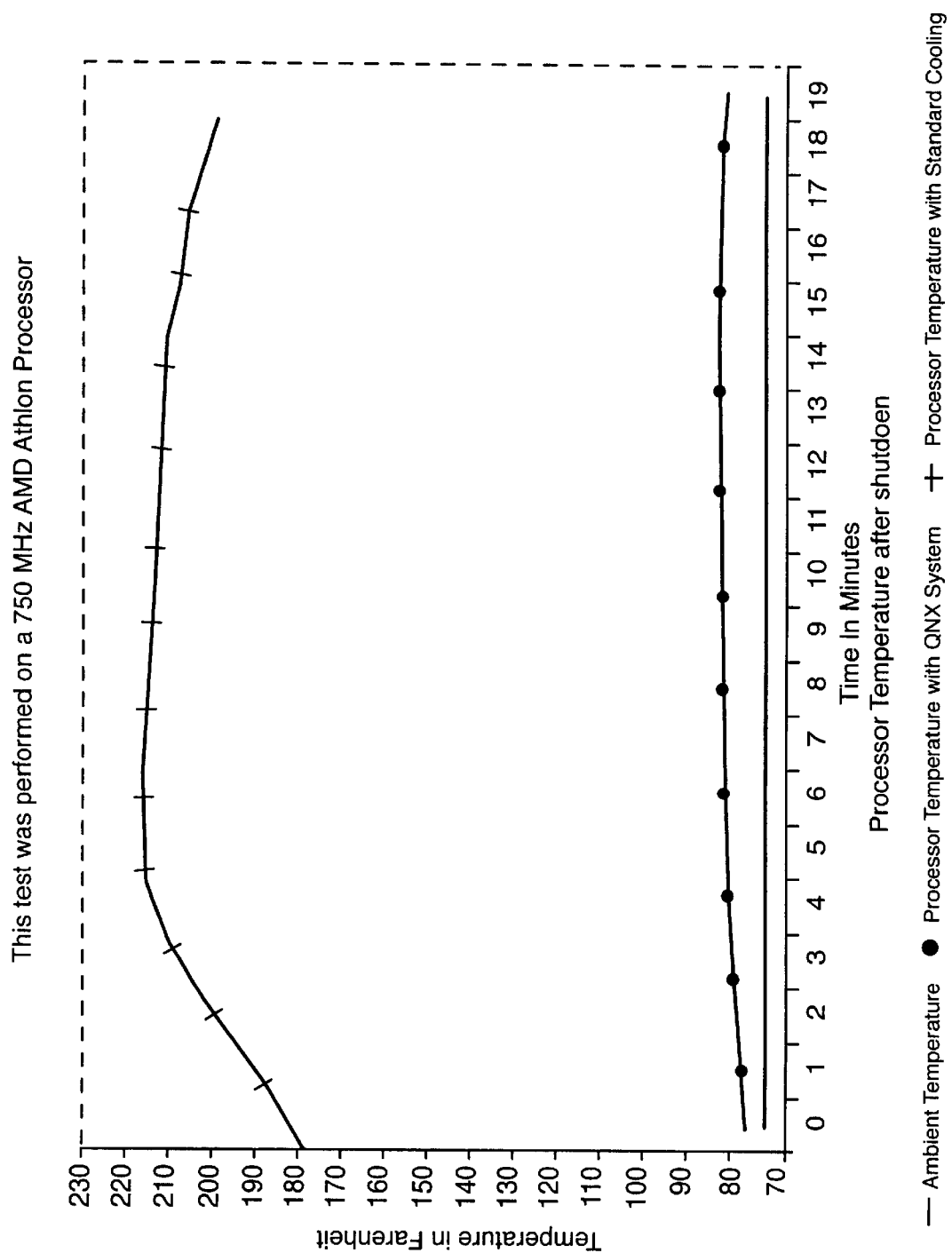
FIG. 9 is a graph similar ti FIG. 8, illustrating temperatures after the computer system is powered off.

More specifically, as processor unit 104 functions, it generates heat. In the case of a typical CPU, the heat generated can easily reach destructive levels. This heat is typically generated at a rate of a certain amount of BTU per second. Heating usually starts at ambient temperature and continues to rise until reaching a maximum, as illustrated in FIG. 8. When the machine is turned off, the heat from unit 104 will peak to an even higher maximum, as illustrated in FIG. 9. This temperature peak can be so high that a microprocessor will fail. This failure may be permanent or temporary. With the present invention this temperature peak is virtually eliminated, as shown in FIG. 9. Operation at higher system speeds will amplify this effect even more. With the present invention, however, unit 104 is cooled to within a few degrees of room temperature. Unit 104 will remain within a few degrees of ambient temperature after system is shut down.

Depending upon specific design constraints and criteria, transfer unit 106 may be coupled to unit 104 in a number of ways. As depicted, transfer unit 106 is engaged with the top surface of unit 104. This contact may be established using, for example, a thermal epoxy, a dielectric compound, or any other suitable contrivance that provides direct and thorough transfer of heat from the surface of unit 104 to the transfer unit 106. A thermal epoxy may be used to facilitate the contact between units 104 and 106. Optionally, the epoxy may have metal casing disposed within to provide better heat removal. Alternatively, a silicon dielectric may be utilized. Alternatively, mechanical fasteners (e.g., clamps or brackets) may be used, alone or in conjunction with epoxy or dielectric, to adjoin the units in direct contact. Other methods can be used or a combination of the methods can be used.

FIG. 6 provides a more detailed illustration of heat transfer unit 608. Unit 608 comprises a heat sink member 606, the outer surface of which is bonded in direct contact with a surface of unit 610 which is a data processing unit. Unit 608 further comprises inlet aperture 602 and outlet aperture 604, adapted to receive fluid from, and return fluid to transport system 108. Unit 608 further comprises chamber 609, through which fluid is circulated across the inner surface of member 606, between apertures 602 and 604. Unit 608 may be formed or assembled from a single homogeneous material or from multiple heterogenous materials, depending upon particular design criteria and constraints. For example, member 606 may comprise a metallic plate (e.g., copper) around which the body 611 of unit 608 is injection molded. Alternatively, all members of unit 608 might be machined from a single piece of a suitable material (e.g., brass or a brass composite). Unit 608 might also be formed using semiconductor processes and materials. It should be appreciated that any material which quickly distributes heat across the entire body of sink element 606 would be suitable.

Transfer unit 608, as depicted, would generally be formed in a shape similar to the processor unit 610 to which it attaches (e.g. rectangular), and may be formed with a width and length up to several times the width and length of unit 610. The outer surface of heat sink member 606 is disposed in direct contact with a surface of unit 610, and is secured or fastened thereto by one or more of the adhesive or mechanical attachments previously described. Unit 608 may also be formed or assembled to have multiple heat sink members adapted to engage with multiple sides of a processing unit, partially or completely encasing the processing unit. As member 606 is in contact with unit 610 (i.e. a heat source), heat flows from unit 610 through member 606 to transfer unit 608. Chamber 609 may comprise a cavity formed such that a fluid (e.g., propylene glycol) can flow through the chamber (i.e. may be flushed through the chamber by transfer system 108). As a fluid flows through chamber 609, heat that is transferred from unit 610 is absorbed by the fluid and thus removed from unit 610. In this manner, the heat is removed from the processing unit using a convection technique, in which the forced movement of a fluid removes heat from a processing device. The present invention uses convection circulation to induce coolant flow while the unit is in a 'power off' mode. This provides cooling for unit 608 after shut down and in the case of component failure.

Thus, heat is initially generated from a processing unit 610 and concentrated where unit 610 makes contact with transfer unit 608—i.e. the heat sink element 606. By providing a heat sink element 606 of material that quickly distributes heat, that heat is quickly removed from unit 610. Additionally, the choice of surface or surfaces to which the transfer unit 608 are engaged also impacts the speed at which heat is dissipated. For example, a larger heat sink element 606 (e.g., with width and length 5 to 6 times the width and length of unit 610), with more surface area than that of the processing unit surface it contacts, would generally dissipate heat faster. The size of the transfer unit and heat sink element can be selected and adjusted based on particular design criteria and constraints (e.g., the overall cabinet size of the computer). The speed at which fluid is flushed through chamber 609 also has a bearing on how quickly heat is removed from unit 610. The quicker fluid is forced through the cavity, the faster heat is removed from processing unit. The fluid may be forced through the chamber in a way that produces a turbulent flow instead of a laminar flow. The turbulent flow creates additional dissipation of heat in some applications. Turbulent or laminar flow may be used in an application to suit the particular design criteria and constraints (e.g., the overall cabinet size of the computer).

Referring back to FIG. 1, transport system 108 further comprises an inlet conduit 114 and an outlet conduit 116. Inlet conduit 114 couples system 110 to inlet aperture 602, transporting cooled fluid therebetween. Outlet conduit 116 couples aperture 604 to system 110, transporting heated fluid therebetween. Conduits 114 and 116 may comprise a number of suitable rigid, semi-rigid, or flexible materials (e.g., copper tubing, metallic flex tubing, or plastic tubing) depending upon desired cost and performance characteristics. In most cases, fluid transport will involve low pressure and temperatures around room temperature. Thus, extreme performance or costly materials may be avoided unless desired. Conduits 114 and 116 may be coupled to system 110 and apertures 602 and 604 using any appropriate permanent or temporary contrivances (e.g., such as soldering, adhesives, or mechanical clamps). System 110 may comprise a coupling 118 to the external surface of system 100 to facilitate heat transfer. Unit 120 is a heat exchange unit used to dissipate heat from the system and has the same function as unit 304 in FIG. 3 described in detail later in the text.

Referring now to FIG. 3, one embodiment of a heat exchange system 300 according to the present invention is depicted. System 300 represents an application of the present invention in larger data processing systems, such as personal computers or server equipment. System 300 comprises a coolant reservoir 302 and a heat exchange unit 304 coupled together by fluidic conduit 306. System 300 further comprises delivery conduit 308, which couples reservoir 302 to a transfer system inlet conduit such as conduit 114. System 300 further comprises return conduit 310, which couples exchange unit 304 to a transfer system outlet conduit such as conduit 116. Conduit 308 transports cooled fluid 312 from reservoir 302 to the transfer system 108. Conduit 310 receives and transfers heated fluid from the transfer system 108 to exchange unit 304. Conduit 306 transports cooled fluid from exchanger 304 back to reservoir 302. Conduits 306, 308, and 310 may comprise a number of suitable rigid, semi-rigid, or flexible materials (e.g., copper tubing, metallic flex tubing, or plastic tubing) depending upon desired cost and performance characteristics. Conduits 306, 308, and 310 may be intercoupled or joined with other system components using any appropriate permanent or temporary contrivances (e.g., such as soldering, adhesives, or mechanical clamps).

For example, conduits 306, 308, and 310 may comprise the form of ducts or tubing, the ducts consisting of both rigid and flexible portions. The rigid portions may comprise 3/8 inch copper tubing. 3/8 inch copper tubing may be integrated into unit 106, reservoir 302, and exchange unit 304; connected at a first end to those elements using, for example, solder, adhesives, or other methods. The copper tubing may then interconnect with other elements using a flexible tubing at its other end.

Reservoir 302 receives and stores cooled fluid 312 from conduit 306. Fluid 312 is a non-corrosive, low toxicity fluid; resilient and resistant to chemical breakdown after repeated usage while providing efficient heat transfer and protection against corrosion. Depending upon particular cost and design criteria, a number of gases and liquids may be utilized in accordance with the present invention (e.g., propylene glycol). Reservoir 302 is a sealed structure appropriately adapted to house conduits 306 and 308. Reservoir 302 is also adapted to house a pump assembly 314. Assembly 314 may comprise a pump motor 316 disposed upon an upper surface of reservoir 302, and an impeller assembly 318 which extends from the pump motor 316 to the bottom portion of reservoir 302 and into coolant 312 stored therein. The portion of conduit 308 within reservoir 302 and pump assembly 314 are adapted to pump fluid 312 from reservoir 302 into and along conduit 308. Conduit 308 may be directly coupled to assembly 314 to satisfy this relationship, or conduit 308 may be disposed proximal to impeller assembly 318 such that the desired pumping is effected.

Exchange unit 304 receives heated fluid from transport system 108 via conduit 310. Unit 304 may be formed or assembled from a suitable thermal conductive material (e.g., brass or copper). Unit 304 comprises one or more chambers, fluidically intercoupled together (e.g., canals or tubes). Heated fluid is received from conduit 310 and transported through unit 304 leaving unit 304 through conduit 306. The fluid flows through the chambers of unit 304 thereby transferring heat from the fluid to the walls of unit 304. Unit 304 may further comprise one or more exchange units 304 to enhance heat transfer from the fluid as it flows through unit 304. Members 304 comprise a structure appropriate to effect the desired heat transfer (e.g., rippled fins).

Depending upon a particular application, system 300 may further comprise one or more air flow elements 324, disposed within system 300 or within a processing system 100 to effect desired heat transfer. Elements 324 may be coupled to, or may constitute, the coupling 118 referred to in FIG. 1. Element 324 may comprise one or more fan assemblies or one or more vents. Element 324 is disposed and adapted to provide or facilitate air flow, as shown by indicators 326, that enhances desired heat transfer. System 300 may also comprise a shielding member or members 328 disposed to isolate the elements of system 300, or to facilitate air flow induced by elements 324.

Referring now to FIG. 4, another embodiment of a heat exchange system 400 according to the present invention is depicted. System 400 represents an application of the present invention in smaller handheld applications, such as palmtop computers, cell phones or PDAs. The material selection and scale of the elements of system 400 are adjusted according to the particular cost, size, and performance criteria of the particular application. System 400 comprises a coolant reservoir 402 and a heat exchange unit 404 coupled together by fluidic conduit 406. System 400 further comprises delivery conduit 408, which couples reservoir 402 to a transfer system inlet conduit such as conduit 114. System 400 further comprises return conduit 410, which couples exchange unit 404 to a transfer system outlet conduit such as conduit 116. Conduit 408 transports cooled fluid 412 from reservoir 402 to the transfer system 108. Conduit 410 receives and transfers heated fluid from the transfer system 108 to exchange unit 404. Conduit 406 transports cooled fluid from exchanger 404 back to reservoir 402. Conduits 406, 408, and 410 may comprise a number of suitable rigid, semi-rigid, or flexible materials (e.g., copper tubing, metallic flex tubing, or plastic tubing) depending upon desired cost and performance characteristics. Conduits 406, 408, and 410 may be intercoupled or joined with other system components using any appropriate permanent or temporary contrivances (e.g., such as soldering, adhesives, or mechanical clamps, or any combination thereof).

Reservoir 402 receives and stores cooled fluid 412 from conduit 406. Fluid 412 is a non-corrosive, low toxicity fluid; resilient and resistant to chemical breakdown after repeated usage while providing efficient heat transfer and corrosion prevention. Depending upon particular cost and design criteria, a number of gases and liquids may be utilized in accordance with the present invention (e.g., propylene glycol). Reservoir 402 is a sealed structure appropriately adapted to house conduits 406 and 408. Reservoir 402 is also adapted to house a pump assembly 414. Assembly 414 may comprise a motor 416 disposed upon an upper surface of reservoir 402, and an impeller assembly 418 which extends from the motor 416 to the bottom portion of reservoir 402 and into coolant 412 stored therein. The portion of conduit 408 within reservoir 402 and assembly 414 are adapted to pump fluid 412 from reservoir 402 into and along conduit 408. Conduit 408 may be directly coupled to assembly 414 to satisfy this relationship, or conduit 408 may be disposed proximal to impeller assembly 418 such that the desired pumping is effected.

Exchange unit 404 receives heated fluid from transport system 108 via conduit 410. Unit 404 may be formed or assembled from a suitable thermal conductive material (e.g., brass or copper). Unit 404 comprises one or more chambers 420, fluidically intercoupled together (e.g., canals or tubes). Heated fluid is received from conduit 410 and transported through unit 404 along the length of chamber 420, leaving unit 404 through conduit 406. The fluid flows through chambers 420 of unit 404, thereby transferring heat from the fluid to the walls of unit 404.

Depending upon a particular application, system 400 may further comprise one or more air flow elements 424, disposed within system 400 to effect desired heat transfer. As depicted, elements 424 may comprise fan blades coupled to motor 416—adapted to provide air circulation as motor 416 operates. Alternatively, system 400 may comprise separate air flows assemblies disposed and adapted to provide or facilitate an air flow that enhances desired heat transfer.

Figure 7:
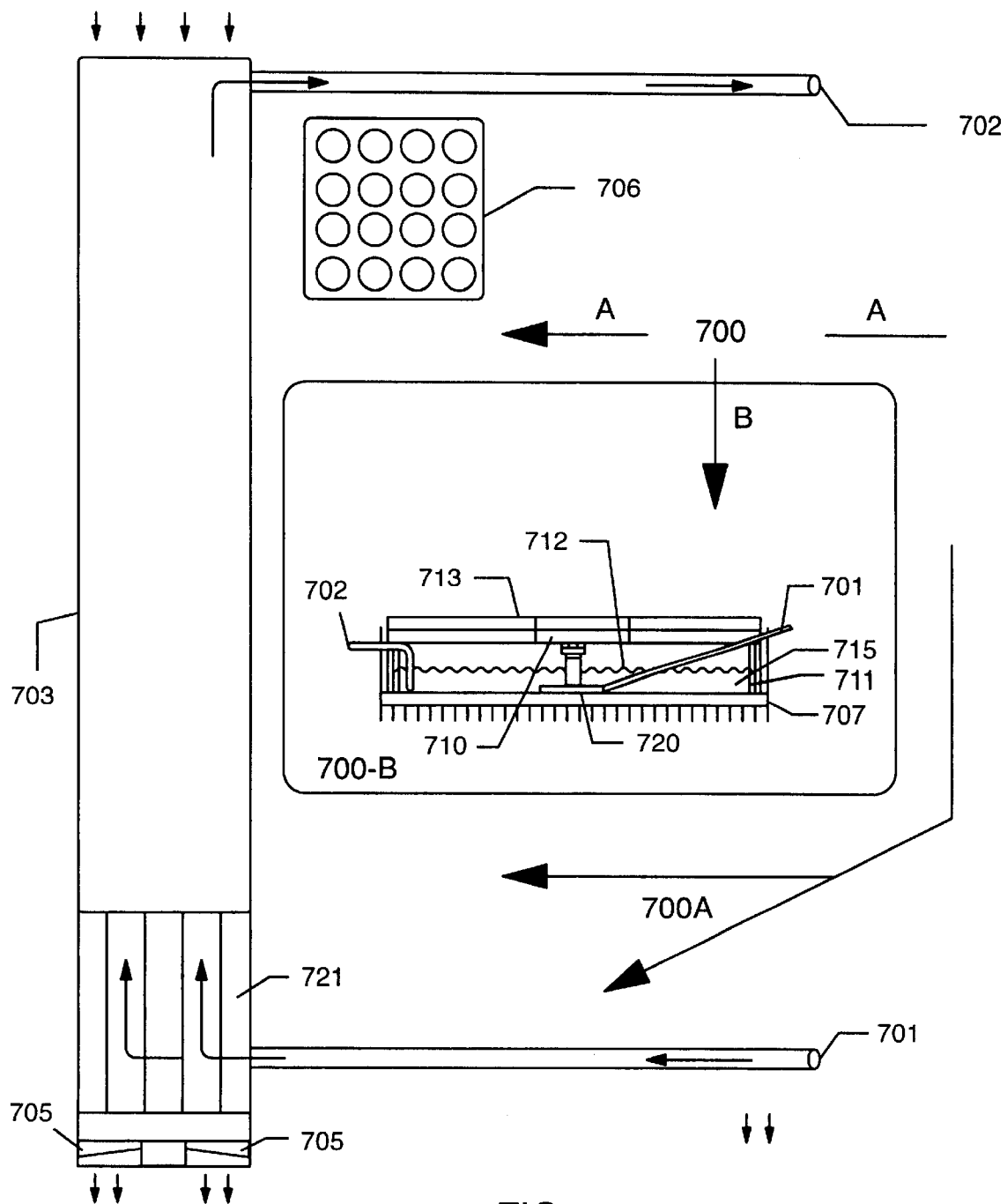
FIG. 7 is an illustrative depiction of a laptop computer cooling system.

Referring to FIG. 7 another embodiment of a heat exchange system according to the present invention is depicted. System 700 A and B represent an application of the present invention in a laptop computer. The material in selection and scale of the elements of system 700 are adjusted according to the particular cost size and performance criteria of the particular application. System 700 comprises a coolant reservoir 711 and a heat exchange unit 703 coupled together by fluidic conduit 702. System 700 further comprises delivery conduit 701, which couples to reservoir 711 to a transfer system inlet conduit such as conduit 114. System 700 further comprises return conduit 702 which couples heat exchange unit 703 to a transfer system outlet conduit such as 116.

Conduits 701, & 702 transport cool fluid 715 from the heat exchanger 703 to the reservoir 711. Conduit 701 receives and transfers heated fluid from the reservoir 711 to exchange unit 703. Conduit's 701 and 702 may comprise a number suitable rigid, semi-rigid, or flexible materials. (e.g., copper tubing, metal flex tubing, or plastic tubing) depending on desired costs and characteristics. Conduit 701 and 702 maybe intercoupled or joined with other system components using any appropriate permanent or temporary contrivances (e.g., such as soldering, adhesives, mechanical clamps), or any combination thereof as disclosed above.

Reservoir 711 receives and stores cooled fluid 715 from conduit 702. Fluid 715 is a non-corrosive, low toxicity fluid; resilient and resistant to chemical breakdown after repeated usage while providing efficient heat transfer. Depending upon particular cost and design criteria, a number of gases and liquids may be utilized in accordance with the present invention (e.g., propylene glycol). Reservoir 711 is a sealed structure appropriately adapted to house conduit's 701 and 702. Reservoir 711 is also adapted to house a pump assembly 712. Assembly 712 may compromise a motor 710 disposed upon an upper surface of reservoir 711, and an impeller assembly 720 which extends from the motor 710 to the bottom portion of reservoir 711 and into coolant 715 stored therein. The portion of conduit 701 within reservoir 711 and assembly 712 are adapted to pump fluid 715 from reservoir 711 into and along conduit 701. Conduit 701 may be directly coupled to assembly 712 to satisfy this relationship or conduit 701 may be disposed proximal to impeller assembly 720 such that the desired pumping is effected. Exchange unit 703 receives heated fluid from transport system 108 via conduit 702. Unit 703 may be formed or assembled from a suitable thermal conductive material (e.g., brass or copper). Unit 703 comprises one or more chambers 721, fluidically intercoupled together (e.g., canals or tubes). Heated fluid is received from conduit 701 and transported through unit 703 along the length of chamber 721, leaving unit 703 through conduit 702. The fluid flows through chambers 721 of unit 703, thereby transferring heat to the walls of unit 703.

Depending upon a particular application, system 700 may further comprise one or more air flow elements 713, & 705 disposed within system 700 to effect desired heat transfer. As depicted, elements 713, & 705 may comprise fan blades coupled to motor 710, & 704 adapted to provide air circulation as motor 710, & 704 operate. Alternatively, system 700 may comprise separate air flow assemblies disposed and adapted to provide or facilitate an air flow that enhances desired heat transfer. In FIG. 7 reservoir 711 is in contact with the processor 707. 711 also serves in this embodiment as the transfer unit 106.

One problem with conventional impeller assemblies is their configuration can result in undesirable noise during operation. This is particularly undesirable in high volume commercial and consumer applications, such as computers and personal communication devices. Conventional impeller designs may also suffer from inefficient fluid movement. The present invention provides an impeller assembly that overcomes such limitations. FIG. 5 provides bottom and side view illustrations, of an impeller assembly 500 according to the present invention. Assembly 500 comprises a base plate 502, through which a shaft 504 is secured by a hub 506. A plurality of blade members 508 (e.g., fins) are disposed upon the upper and or lower surface of plate 502. Members 508 are co-radially curved along their outer lengths. Assembly 500 may further comprise one or more apertures 510, formed through base plate 502. Apertures 510 are disposed in relation to members 508, and members 508 may be curved, or any other shape to enhance fluidic movement induced by assembly 500. A variety of curved or straight blades may be used to minimize disruptive rotational effects of assembly 500. In some applications apertures may be necessary to prevent cavitation and excessive noise depending up on the specific application.

It is important to note that the teachings of the present invention may be implemented and configured within a data processing system (e.g., a computer) such that they provide operational benefit even in the absence of active fluid pumping (e.g., pump motor or assembly fails). By positioning the heat transfer unit, transport system, and heat exchange system within a data processing appropriately, the present invention employ the natural physics of convective heating and cooling to cycle fluidic coolant circulated through the system.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. The teachings and concepts of the present invention may be applied to other types of components, systems and structures—the principles of the present invention are practicable in a number of applications and technologies. It is therefore intended that the appended claims encompass any such modifications or embodiments.

What is claimed is:

1. A system for dissipating heat from an electronic data processor disposed in a casing of an electronic device, comprising:

an electronic data processor;

a heat transfer unit attached to the processor and having an inner chamber therein including a fluid inlet and a fluid outlet to allow fluid flow therethrough for transferring heat from the processor to the fluid;

a heat exchange unit including a heat dissipator in fluid communication with the outlet of the heat transfer unit and configured to receive heated fluid from the heat transfer unit and cool the heated fluid for return to the heat transfer unit;

a fluid reservoir in fluid communication with the heat dissipator for temporarily storing cooled fluid;

a pump including a shaft-driven impeller disposed within the reservoir for circulating fluid through the system; and an air flow device for directing air from within the electronic device over the heat dissipator and out of the casing.

2. The system of claim 1, wherein the heat transfer unit includes a heat sink coupled thereto for removing heat from the processor.

3. The system of claim 1, wherein the heat transfer unit is of larger dimension than the processor.

4. The system of claim 1, wherein the heat dissipator comprises multiple chambers fluidically coupled with one another.

5. The system of claim 1, wherein the heat dissipator comprises an enlarged housing defining an interior chamber through which the heated fluid flows.

6. The system of claim 5, wherein the housing includes heat dissipating fins extending therefrom.

7. The system of claim 1, wherein the pump comprises a motor disposed without the reservoir having a shaft extending therefrom and into the reservoir and blades radially attached to the shaft for circulating the fluid.

8. The system of claim 1, wherein the heat transfer unit is configured to facilitate turbulent flow of fluid therethrough.

9. The system of claim 1, wherein the fluid inlet of the heat transfer unit is formed at a lower end thereof and the fluid outlet is formed at an upper end thereof to facilitate convective fluid flow therethrough.

10. The system of claim 1, wherein the fluid comprises a propylene glycol coolant.

11. The system of claim 1, wherein the blades of the impeller are disposed in a lower portion of the reservoir and are self-priming.

12. The system of claim 1, wherein a housing of the heat dissipator is configured to facilitate convective flow therethrough.

13. A system for dissipating heat from an electronic data processor disposed in a casing of an electronic device, comprising:
    an electronic data processor;
    a heat transfer unit attached to the processor and having an inner chamber therein including a fluid inlet at a bottom end thereof and a fluid outlet at an upper end thereof to allow forced fluid flow therethrough, and facilitate convective fluid flow therethrough for transferring heat from the processor to the fluid;
    a heat exchange unit including a heat dissipator in fluid communication with the outlet of the heat transfer unit and configured to receive heated fluid from the heat transfer unit and cool the heated fluid for return to the heat transfer unit, the heat dissipator including a housing of larger internal surface area than the heat transfer unit through which the fluid flows, and heat dissipating fins extending from the housing;
    a fluid reservoir in fluid communication with the heat dissipator for temporarily storing cooled fluid;
    a self-priming pump including a motor disposed outside of the reservoir and having a shaft extending into the reservoir to an impeller having blades within a lower portion of the reservoir for circulating fluid through the system; and
    an air flow device for directing air from within the electronic device over the heat dissipator and out of the casing.

14. The system of claim 13, wherein the pump comprises a motor having a shaft extending therefrom and blades radially attached to the shaft for circulating the fluid.

15. The system of claim 13, wherein the pump is disposed in the fluid reservoir of the heat exchange unit for circulating cooled liquid to the heat transfer unit.

16. The system of claim 13, including a heat sink disposed between the heat transfer unit and the processor for transferring heat from the processor to the heat transfer unit.

17. The system of claim 13, wherein the heat transfer unit has a contact surface of larger dimension than a contact surface of the processor.

18. The system of claim 13, wherein the housing of the heat dissipator includes a plurality of inner chambers fluidly coupled to one another.

19. The system of claim 13, wherein the heat transfer unit is configured to facilitate turbulent flow of fluid therethrough.

20. The system of claim 13, wherein the fluid comprises a propylene glycol coolant.

21. The system of claim 13, wherein a housing of the heat dissipator is configured to facilitate convective flow therethrough.

* * * * *